United States Patent
Chuang et al.

(10) Patent No.: US 12,463,161 B2
(45) Date of Patent: Nov. 4, 2025

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Po-Yao Chuang, Hsinchu (TW); Po-Hao Tsai, Zhongli (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/597,222

(22) Filed: Mar. 6, 2024

(65) Prior Publication Data

US 2024/0250046 A1 Jul. 25, 2024

Related U.S. Application Data

(60) Continuation of application No. 17/372,677, filed on Jul. 12, 2021, now Pat. No. 11,996,372, which is a
(Continued)

(51) Int. Cl.
*H01L 23/66* (2006.01)
*H01L 21/48* (2006.01)
(Continued)

(52) U.S. Cl.
CPC .......... *H01L 23/66* (2013.01); *H01L 21/4857* (2013.01); *H01L 21/568* (2013.01);
(Continued)

(58) Field of Classification Search
CPC ... H01L 23/66; H01L 21/4857; H01L 21/568; H01L 23/367; H01L 23/49811; H01L 23/49822; H01L 23/49827; H01L 25/0655; H01L 2223/6677; H01L 23/49816; H01L 24/16; H01L 24/20; H01L 21/6835; H01L 21/563; H01L 2221/68345; H01L 2221/68359; H01L 2224/12105; H01L 2224/16227; H01L 2224/19;
(Continued)

(56) References Cited

U.S. PATENT DOCUMENTS 9,735,118 B2 8/2017 Wang et al.
10,032,722 B2 7/2018 Yu et al.
(Continued)

FOREIGN PATENT DOCUMENTS

CN 102263090 A 11/2011
CN 106847794 A 6/2017
(Continued)

*Primary Examiner* — Evan G Clinton
(74) *Attorney, Agent, or Firm* — Slater Matsil, LLP

(57) ABSTRACT

A semiconductor device and manufacturing process are provided wherein a first semiconductor device is electrically connected to redistribution structures. An antenna structure is located on an opposite side of the first semiconductor device from the redistribution structures, and electrical connections separate from the first semiconductor device connect the antenna structure to the redistribution structures.

20 Claims, 13 Drawing Sheets

Related U.S. Application Data division of application No. 16/185,749, filed on Nov. 9, 2018, now Pat. No. 11,063,007.

(60) Provisional application No. 62/674,337, filed on May 21, 2018.

(51) Int. Cl.
*H01L 21/56* (2006.01)
*H01L 23/367* (2006.01)
*H01L 23/498* (2006.01)
*H01L 25/065* (2023.01)
*H01Q 1/22* (2006.01)

(52) U.S. Cl.
CPC ...... *H01L 23/367* (2013.01); *H01L 23/49811* (2013.01); *H01L 23/49822* (2013.01); *H01L 23/49827* (2013.01); *H01L 25/0655* (2013.01); *H01Q 1/2283* (2013.01); *H01L 2223/6677* (2013.01)

(58) Field of Classification Search
CPC ....... H01L 2224/20; H01L 2224/32225; H01L 2224/73253; H01L 2224/73267; H01L 2224/81005; H01L 21/486; H01L 2224/73204; H01L 2924/15331; H01L 2924/18161; H01L 23/13; H01L 23/3677; H01L 23/5384; H01L 23/5383; H01L 23/5385; H01L 23/5389; H01L 21/561; H01L 23/49838; H01L 23/58; H01L 23/525; H01L 23/31; H01L 23/481; H01L 2224/02379; H01Q 1/2283; H01Q 9/0457; H01Q 21/0087; H01Q 21/062; H01Q 21/065

See application file for complete search history.

(56) References Cited

U.S. PATENT DOCUMENTS

| | | | |
|---|---|---|---|
| 10,157,807 | B2 | 12/2018 | Chiang et al. |
| 10,269,732 | B2 | 4/2019 | Yu et al. |
| 2009/0309212 | A1 | 12/2009 | Shim et al. |
| 2011/0210444 | A1 | 9/2011 | Jeng et al. |
| 2011/0285606 | A1 | 11/2011 | De Graauw et al. |
| 2011/0291288 | A1 | 12/2011 | Wu et al. |
| 2013/0009320 | A1 | 1/2013 | Yoo et al. |
| 2013/0062760 | A1 | 3/2013 | Hung et al. |
| 2014/0008773 | A1 | 1/2014 | Yen et al. |
| 2014/0252647 | A1 | 9/2014 | Huang et al. |
| 2014/0266902 | A1 | 9/2014 | Kamgaing et al. |
| 2015/0380340 | A1 | 12/2015 | Cheng et al. |
| 2016/0027764 | A1 | 1/2016 | Kim et al. |
| 2016/0240492 | A1 | 8/2016 | Wolter et al. |
| 2017/0229322 | A1 | 8/2017 | Hsu et al. |
| 2018/0337148 | A1* | 11/2018 | Baek ................. H01L 24/20 |
| 2018/0350772 | A1* | 12/2018 | Nair ................ H01L 23/5383 |
| 2019/0088603 | A1 | 3/2019 | Marimuthu et al. |
| 2019/0131690 | A1* | 5/2019 | Lu ..................... H01Q 9/26 |
| 2019/0139912 | A1 | 5/2019 | Kim et al. |
| 2019/0157206 | A1 | 5/2019 | Wang et al. |
| 2020/0066663 | A1* | 2/2020 | Aleksov ............. H01L 23/00 |

FOREIGN PATENT DOCUMENTS

| | | |
|---|---|---|
| CN | 107452721 A | 12/2017 |
| EP | 2469592 A1 | 6/2012 |
| KR | 20130005811 A | 1/2013 |
| KR | 20160001586 A | 1/2016 |
| KR | 20160012589 A | 2/2016 |
| KR | 20170094484 A | 8/2017 |
| TW | 201724440 A | 7/2017 |
| TW | 201742204 A | 12/2017 |
| TW | 201743428 A | 12/2017 |
| TW | 201804591 A | 2/2018 |

* cited by examiner

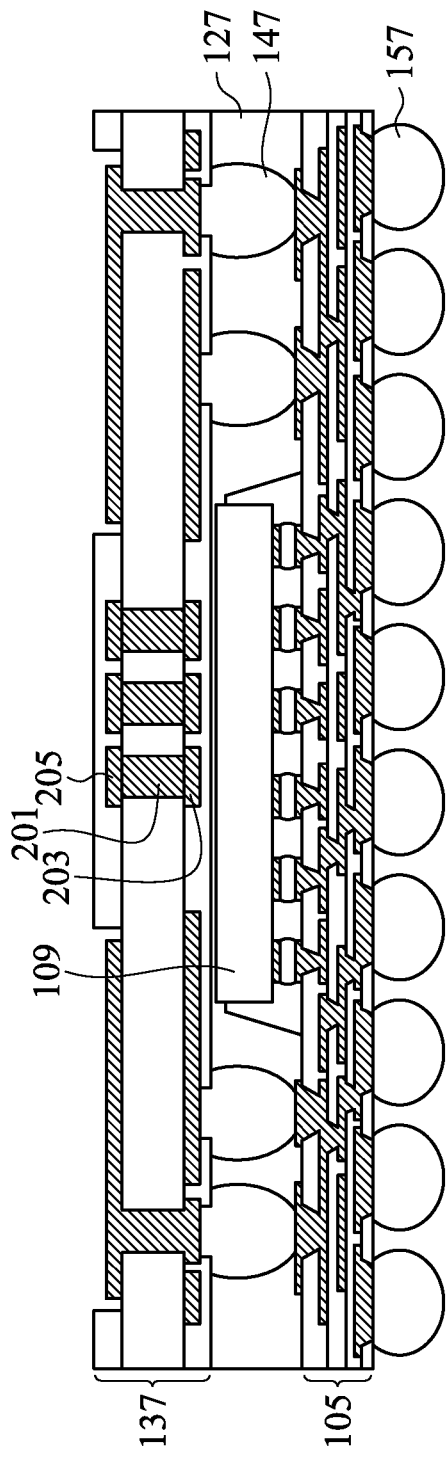
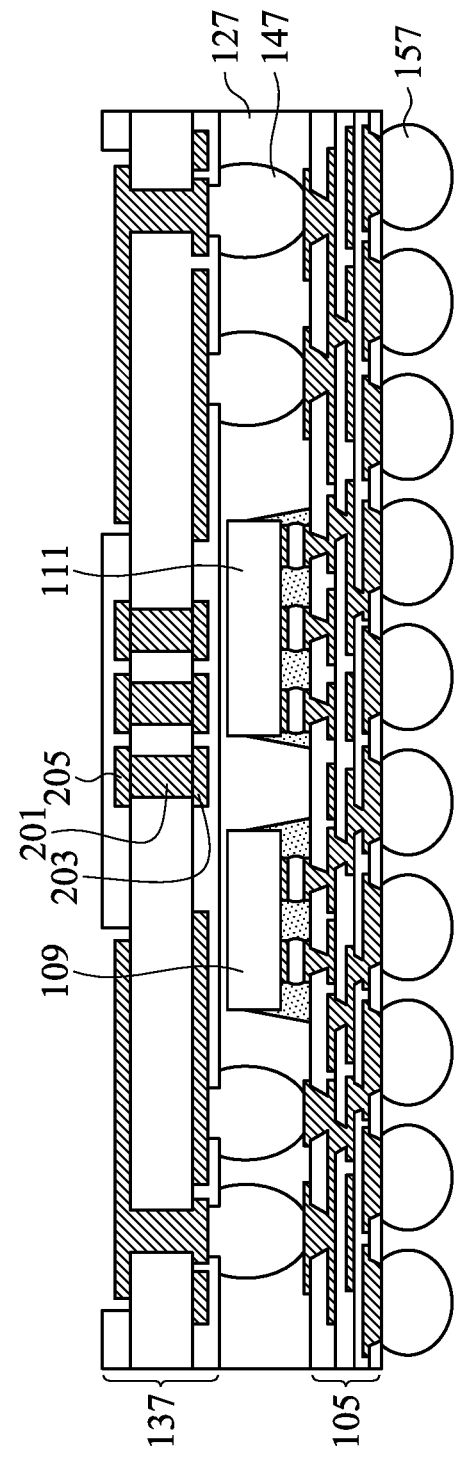
FIG. 2C
FIG. 2D

SEMICONDUCTOR DEVICE AND METHOD OF MANUFACTURE

PRIORITY CLAIM AND CROSS-REFERENCE

This application is a continuation of U.S. patent application Ser. No. 17/372,677, filed on Jul. 12, 2021, entitled "Semiconductor Device and Method of Manufacture," which is a divisional of U.S. patent application Ser. No. 16/185,749, filed on Nov. 9, 2018, entitled "Semiconductor Device and Method of Manufacture," now U.S. Pat. No. 11,063,007, issue on Jul. 13, 2021, which claims priority to and the benefit of U.S. Provisional Application No. 62/674,337, filed on May 21, 2018, entitled "Semiconductor Device and Method of Manufacture," which applications are hereby incorporated herein by reference in their entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2F illustrate thermal vias incorporated into the integrated fan out structure in accordance with some embodiments.

DETAILED DESCRIPTION

Figure 1A:
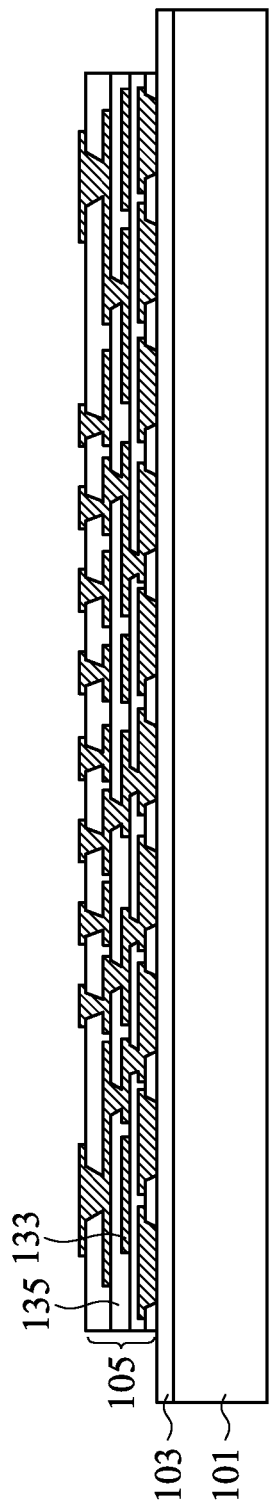
FIGS. 1A-1G illustrate an integrated antenna in an integrated fan out structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described below with respect to a particular application utilizing a heterogeneous fan out structure for millimeter wave radio frequency applications. However, the embodiments are not intended to be limited to these embodiments, and the embodiments may be used in a wide variety of applications.

With reference now to FIG. 1A, there is illustrated a carrier substrate 101, an adhesive layer 103, and a first redistribution layer 105 over the carrier substrate 101. In an embodiment the carrier substrate 101 comprises, for example, silicon based materials, such as glass or silicon oxide, or other materials, such as aluminum oxide, combinations of any of these materials, or the like. The carrier substrate 101 is planar in order to accommodate a formation of the first redistribution layer 105.

The adhesive layer 103 may be placed over the carrier substrate 101 in order to assist in the formation of overlying structures to the carrier substrate 101. In an embodiment the adhesive layer 103 is a die attached film (DAF), such as an epoxy resin, a phenol resin, acrylic rubber, silica filler, or a combination thereof, and is applied using a lamination technique. In an embodiment the adhesive layer 103 may be a release film such as a light-to-heat-conversion (LTHC) film. In yet another embodiment the adhesive layer 103 may be a bi-layer comprising a release film along with an overlying polymer layer in order to provide a surface for further processing. However, any other suitable material and method of formation may be utilized.

Once the adhesive layer 103 has been placed, optional underbump metallization layers and the first redistribution layers 105 may be formed over the adhesive layer 103. In an embodiment the underbump metallization layers may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the underbump metallization layers. Any suitable materials or layers of material that may be used for the underbump metallization layers are fully intended to be included within the scope of the embodiments.

In an embodiment the underbump metallization layers are created by forming each layer over the adhesive layer 103. The forming of each layer may be performed using a plating process, such as electrochemical plating, although other processes of formation, such as sputtering, evaporation, or PECVD process, may also be used depending upon the desired materials. The underbump metallization layers may be formed to have a thickness of between about 0.7 µm and about 10 µm, such as about 5 µm.

In an embodiment the first redistribution layers 105 comprise a series of conductive layers 133 (such as two or three conductive layers) embedded within a series of dielectric layers 135 (such as three or four dielectric layers) that are utilized to provide not only conductive routing for signals, but which may also be utilized to provide structures such as integrated inductors or capacitors. In an embodiment, a first one of the series of dielectric layers 135 is formed over the adhesive layer 103, and the first one of the series of dielectric layers 135 may be a material such as polybenzoxazole (PBO), although any suitable material, such as polyimide or a polyimide derivative, may be utilized. The first one of the series of dielectric layers 135 may be placed using, e.g., a spin-coating process, although any suitable method may be used.

After the first one of the series of dielectric layers 135 has been formed, openings may be made through the first one of the series of dielectric layers 135 by removing portions of the first one of the series of dielectric layers 135. The openings may be formed using a suitable photolithographic mask and etching process, although any suitable process or processes may be used to pattern the first one of the series of dielectric layers 135.

Once the first one of the series of dielectric layers 135 has been formed and patterned, a first one of the series of conductive layers 133 is formed over the first one of the series of dielectric layers 135 and through the openings formed within the first one of the series of dielectric layers 135. In an embodiment the first one of the series of conductive layers 133 may be formed by initially forming a seed layer of a titanium copper alloy through a suitable formation process such as CVD or sputtering. A photoresist may then be formed to cover the seed layer, and the photoresist may then be patterned to expose those portions of the seed layer that are located where the first one of the series of conductive layers 133 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or PVD, may be used to form the first one of the series of conductive layers 133. Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Once the first one of the series of conductive layers 133 has been formed, a second one of the series of dielectric layers 135 and a second one of the series of conductive layers 133 may be formed by repeating steps similar to the first one of the series of dielectric layers 135 and the first one of the series of conductive layers 133. These steps may be repeated as desired in order to electrically connect each of the series of conductive layers 133 to an underlying one of the series of conductive layers 133, and may be repeated as often as desired until an uppermost one of the series of conductive layers 133 and an uppermost one of the series of dielectric layers 135 has been formed. In an embodiment the deposition and patterning of the series of conductive layers 133 and the series of dielectric layers 135 may be continued until the first redistribution layers 105 have a desired number of layers, although any suitable number of individual layers may be utilized.

Figure 1B:
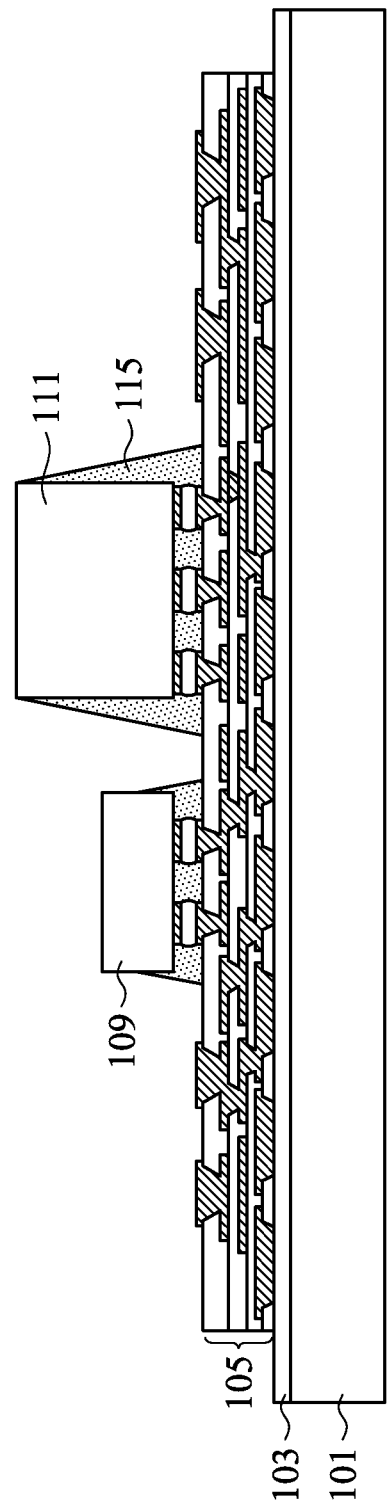

FIG. 1B illustrates a connection of a first semiconductor device 109 and a second semiconductor device 111 to the first redistribution layers 105. In an embodiment the first semiconductor device 109 may be a semiconductor die that provides logic functions for the structures. For example the first semiconductor device 109 may be a power management integrated circuit (PMIC), although any suitable logic function or other functions may be utilized. In some embodiments the first semiconductor device 109 may be the same as the second semiconductor device 111 such as an RFFE, an IC, a RF chip or a power amplifier (PA).

In an embodiment the first semiconductor device 109 comprises a first substrate, first active devices, first metallization layers, first contact pads, and first external connectors. The first substrate may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional requirements of the design for the first semiconductor device 109. The first active devices may be formed using any suitable methods either within or else on the first substrate.

The first metallization layers of the first semiconductor device 109 are formed over the first substrate and the first active devices and are designed to connect the various active devices to form functional circuitry. In an embodiment the first metallization layers are formed of alternating layers of dielectric and conductive material and may be formed through any suitable process (such as deposition, damascene, dual damascene, etc.). In an embodiment there may be four layers of metallization separated from the first substrate by at least one interlayer dielectric layer (ILD), but the precise number of first metallization layers is dependent upon the design of the first semiconductor device 109.

The first contact pads may be formed over and in electrical contact with the first metallization layers. The first contact pads may comprise aluminum, but other materials, such as copper, may also be used. The first contact pads may be formed using a deposition process, such as sputtering, to form a layer of material (not shown) and portions of the layer of material may then be removed through a suitable process (such as photolithographic masking and etching) to form the first contact pads. However, any other suitable process may be utilized to form the first contact pads. The first contact pads may be formed to have a thickness of between about 0.5 µm and about 10 µm, such as about 7 µm.

The first external connectors may be formed to provide conductive regions for contact between the first contact pads and the first redistribution layers 105. The first external connectors may be conductive bumps (e.g., microbumps) or conductive pillars utilizing materials such as solder and copper. In an embodiment in which the first external connectors is a contact bump, the first external connectors may comprise a material such as tin, or other suitable materials, such as silver, lead-free tin, or copper. In an embodiment in which the first external connectors is a tin solder bump, the first external connectors may be formed by initially forming a layer of tin through such commonly used methods such as evaporation, electroplating, printing, solder transfer, ball placement, etc., to a thickness of, e.g., about 20 μm. Once a layer of tin has been formed on the structure, a reflow may be performed in order to shape the material into the desired bump shape.

In embodiments in which the first external connectors are conductive pillars, the first external connectors may be formed by initially placing a photoresist and then patterning the photoresist into the desired pattern for the conductive pillars. A plating process is then utilized to form the conductive material (e.g., copper) in connection with the first contact pads. However, any suitable methods may be utilized.

Additionally, as one of ordinary skill in the art will recognize, the above described process to form the first external connectors are merely descriptions, and are not meant to limit the embodiments to these exact processes. Rather, the described processes are intended to be merely illustrative, as any suitable process for forming the first external connectors may be utilized.

Once formed, the first semiconductor device 109 may be placed on the first redistribution layers 105 using, e.g., a pick and place tool. For example, the first external connectors of the first semiconductor device 109 may be aligned with and placed in physical contact with corresponding locations of the first redistribution layers 105. Once in physical contact, a reflow process may be performed in order to reflow the first external connectors and bond the first semiconductor device 109 with the first redistribution layers 105. In some embodiments an optional UBM may be formed on the first redistribution layers 105 prior to the placement of the first semiconductor device 109.

The second semiconductor device 111 may be utilized to provide functionality to the overall structure, such as by being radio frequency front end devices such as low noise amplifiers (LNAs), low loss filters, power amplifiers (PAs), baseband modules (BB), switching functions, signal conditioning, combinations of these, or the like. The second semiconductor device 111 may be similar to the first semiconductor device 109 such as by having a similar thickness and having a second semiconductor substrate, second active and/or passive devices formed on the second semiconductor substrate, second contact pads, and second external connectors similar to the first semiconductor substrate, the first active devices, first contact pads, and first external connectors, respectively. However, any suitable structures may be utilized.

Additionally, the second semiconductor device 111 may be placed on the first redistribution layers 105 using, e.g., a pick and place tool. For example, the second external connectors of the semiconductor device 111 may be aligned with and placed in physical contact with corresponding locations of the first redistribution layers 105. Once in physical contact, a reflow process may be performed in order to reflow the second external connectors and bond the second semiconductor device 111 with the first redistribution layers 105.

Once the first semiconductor device 109 and the second semiconductor device 111 have been bonded (either simultaneously or separately), an underfill material 115 may be placed between the first redistribution layers 105 and both the first semiconductor device 109 and the second semiconductor device 111 in order to help protect and isolate the devices. In an embodiment the underfill material 115 is a protective material used to cushion and support the first semiconductor device 109 and the second semiconductor device 111 from operational and environmental degradation, such as stresses caused by the generation of heat during operation. The underfill material 115 may comprise, for example, a liquid epoxy or other protective material, and then cured to harden and may be dispensed by, e.g., injection.

Figure 1C:
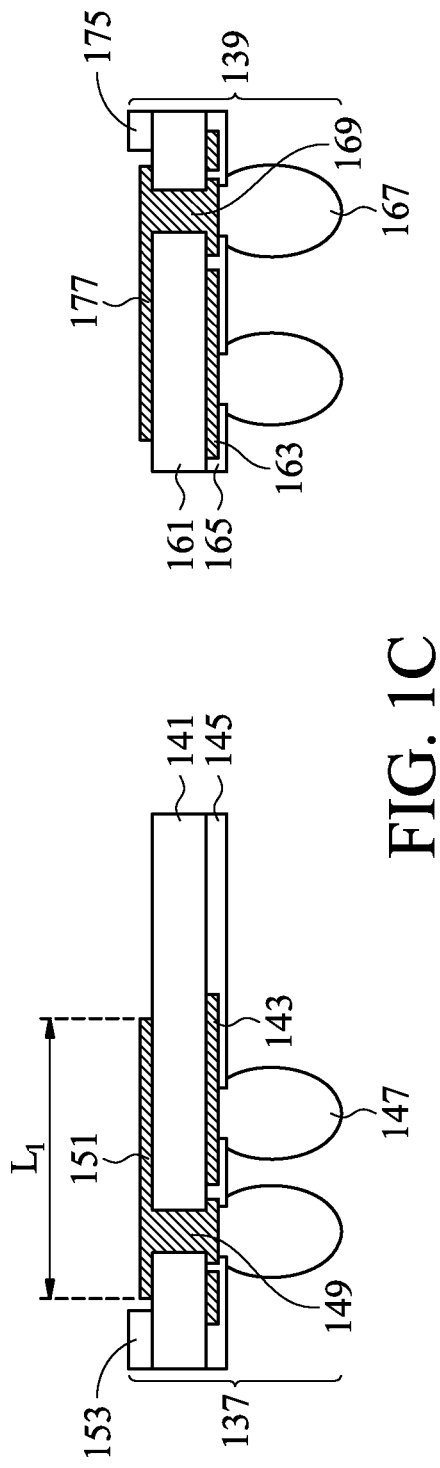

FIG. 1C illustrates a formation of a first antenna structure 137 and a second antenna structure 139 that will be bonded to the first redistribution layers 105. While illustrated as being separate from each other in FIG. 1C, in embodiments the first antenna structure 137 and the second antenna structure 139 may be located in a same component and manufactured simultaneously with each other. In an embodiment the first antenna structure 137 comprises a first antenna substrate 141, a second redistribution layer 143, a first passivation layer 145 over the second redistribution layer 143, second external connections 147, a feeding element 149, an first upper antenna layer 151, and a second passivation layer 153.

In an embodiment the first antenna substrate 141 may comprise one or more layers of a substrate material such as an organic polymer material (e.g., a polymer such as resin, benzocyclobutane (BCB), or a prepreg material), a glass material (e.g., silicon dioxide), a ceramic material, bulk silicon, doped or undoped, or an active layer of a silicon-on-insulator (SOI) substrate. Other substrates that may be used include multi-layered substrates, gradient substrates, or hybrid orientation substrates. Any suitable substrate material may be utilized.

Optionally, the first antenna substrate 141 may be formed with conductive tracing (e.g., metal tracing) or routing built within the first antenna substrate 141 to allow for additional routing. In such an embodiment the metal tracing may be formed by applying a seed layer over one of the layers of polymer material, and then placing and patterning a photoresist over the seed layer. Once patterned in the shape of the desired conductive tracing, a plating process using the seed layer may be used to form the conductive tracing, the photoresist may be removed, and the seed layer may be etched. This process may be repeated on each layer of polymer material, with overlying layers of conductive tracing being formed in electrical contact with underlying layers. However, any other suitable process, such as damascene or dual damascene processes, may also be utilized.

A feeding element 149 may be formed through the first antenna substrate 141 in order to electrically connect the first upper antenna layer 151 on a first side of the first antenna substrate 141 to the second external connections 147 on a second side of the first antenna substrate 141 opposite the first side. In an embodiment the feeding element 149 may be, e.g., a through substrate via (TSV) which extends from a first side of the first antenna substrate 141 to a second side of the first antenna substrate 141 and may be formed by initially forming openings into the first antenna substrate 141. The openings may be formed by applying and developing a suitable photoresist, and removing portions of the first antenna substrate 141 that are exposed to the desired depth. The openings may be formed so as to extend into the first antenna substrate 141 to a depth greater than the eventual desired height of the first antenna substrate 141.

Once the openings have been formed within the first antenna substrate 141, the openings may be lined with a liner. The liner may be, e.g., an oxide formed from tetraethylorthosilicate (TEOS) or silicon nitride, although any suitable dielectric material may be used. The liner may be formed using a plasma enhanced chemical vapor deposition (PECVD) process, although other suitable processes, such as physical vapor deposition or a thermal process, may be used. Additionally, the liner may be formed to a thickness of between about 0.1 µm and about 5 µm, such as about 1 µm.

Once the liner has been formed along the sidewalls and bottom of the openings, a barrier layer (also not independently illustrated) may be formed and the remainder of the openings may be filled with first conductive material. The first conductive material may comprise copper, although other suitable materials such as aluminum, alloys, doped polysilicon, combinations thereof, and the like, may be utilized. The first conductive material may be formed by electroplating copper onto a seed layer (not shown), filling and overfilling the openings. Once the openings have been filled, excess liner, barrier layer, seed layer, and first conductive material outside of the openings may be removed through a planarization process such as chemical mechanical polishing (CMP), although any suitable removal process may be used.

After the feeding element 149 has been formed, the second redistribution layer 143 may be formed. In an embodiment a first portion of the second redistribution layer 143 may be formed in electrical connection with the feeding element 149 in order to provide a connection for signals to be sent and received from the first upper antenna layer 151 on the opposite side of the first antenna substrate 141. Additionally, a second portion of the second redistribution layer 143 is electrically connected to ground (e.g., through the second external connections 147) and operates as a grounded element or ground plane.

In an embodiment the second redistribution layer 143 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the second redistribution layer 143 is desired to be located.

Once the photoresist has been formed and patterned, a conductive material, such as copper, may be formed on the seed layer through a deposition process such as plating. The conductive material may be formed to have a thickness of between about 1 µm and about 20 µm, such as about 15 µm. However, while the material and methods discussed are suitable to form the conductive material, these materials are merely exemplary. Any other suitable materials, such as AlCu or Au, and any other suitable processes of formation, such as CVD or PVD, may be used to form the second redistribution layer 143.

Once the conductive material has been formed, the photoresist may be removed through a suitable removal process such as chemical stripping and/or ashing. Additionally, after the removal of the photoresist, those portions of the seed layer that were covered by the photoresist may be removed through, for example, a suitable etch process using the conductive material as a mask.

Additionally, while a process which comprises a photoresist and plating is described as one embodiment of forming the second redistribution layer 143, this description is intended to be illustrative and is not intended to be limiting. Rather, any suitable method of manufacturing the second redistribution layer 143 may be utilized. For example, the second redistribution layer 143 may also be manufactured using a blanket deposition process followed by a subsequent photolithographic patterning and etching process. This process and any other suitable process are fully intended to be included within the scope of the embodiments.

Once the second redistribution layer 143 has been formed, the first passivation layer 145 may be formed over the second redistribution layer 143. In an embodiment the first passivation layer 145 may be polybenzoxazole (PBO), although any suitable material, such as polyimide or a polyimide derivative, such as a low temperature cured polyimide, may be utilized. The first passivation layer 145 may be placed using, e.g., a spin-coating process to a thickness of between about 5 µm and about 20 µm, such as about 15 µm, although any suitable method and thickness may be used.

Once the first passivation layer 145 has been formed, the first passivation layer 145 may be patterned in order to expose portions of the second redistribution layer 143, and second external connections 147 may be formed or otherwise placed in electrical connection with the second redistribution layer 143. In an embodiment the first passivation layer 145 may be patterned using, e.g., a photolithographic masking and etching process. However, any suitable method may be utilized.

The second external connections 147 may be formed or placed through the first passivation layer 145 and may be a ball grid array (BGA) which comprises a eutectic material such as solder, although any suitable materials may be used. In an embodiment in which the second external connections 147 are solder balls, the second external connections 147 may be formed using a ball drop method, such as a direct ball drop process. In another embodiment, the solder balls may be formed by initially forming a layer of tin through any suitable method such as evaporation, electroplating, printing, solder transfer, and then performing a reflow in order to shape the material into the desired bump shape. Once the second external connections 147 have been formed, a test may be performed to ensure that the structure is suitable for further processing.

On the other side of the first antenna substrate 141 the first upper antenna layer 151 is formed onto the first antenna substrate 141 in electrical connection with the feeding element 149. The first upper antenna layer 151 is utilized along with the grounded element (within the second redistribution layer 143) in order to operate as the antenna. In particular, the first upper antenna layer 151, upon receiving signals from, e.g., the first semiconductor device 109 or the second semiconductor device 111, will operate as an excited and radiating element, causing an electric field to be formed between the first upper antenna layer 151 and the grounded element within the second redistribution layer 143. In operation, the electric field that has been created will resonate between the first upper antenna layer 151 and the grounded element within the second redistribution layer 143, causing standing waves to be created between the first upper antenna layer 151 and the grounded element within the second redistribution layer 143. The standing waves will exit out from between the first upper antenna layer 151 and the grounded element within the second redistribution layer 143, thereby causing an electromagnetic wave to be transmitted.

In an embodiment the first upper antenna layer 151 is formed in a similar fashion as the second redistribution layer 143. For example, the first upper antenna layer 151 may be formed using a process such as by plating on a seed layer or else a blanket deposition and subsequent patterning process. However, any suitable method of manufacturing may be utilized to form the first upper antenna layer 151.

Additionally, the first upper antenna layer 151 is sized based on the desired electrical field to be operated between the first upper antenna layer 151 and the grounded element within the second redistribution layer 143. For example, the first upper antenna layer 151 may be sized so that the electric field that is created will resonate at a fundamental mode of the desired radiation pattern. Additionally, the dimensions will also depend on a number of desired parameters, such as the desired frequency of operation and the type of antenna. In a particular embodiment in which the antenna is a patch antenna, the first upper antenna layer 151 may be manufactured to have a length that is one half of the wavelength of the signal desired to be transmitted. Similarly in this embodiment, the width of the first upper antenna layer 151 may be manufactured to have a width that provides a desired input impedance. However, any suitable parameters may be utilized.

In a particular embodiment in which the signal to be transmitted and/or received is at a wavelength of about 10.6 mm, the first upper antenna layer 151 may have a first length $L_1$ of between about 2.6 mm and about 5.3 mm, such as about 5 mm. Additionally, the first upper antenna layer 151 may be formed to have a first width $W_1$ (not separately illustrated in FIG. 1C as it extends into and out of the Figure) of between about 2.6 mm and about 5.3 mm, such as about 5 mm. However, any suitable dimensions may be utilized.

Once the first upper antenna layer 151 has been formed, the second passivation layer 153 may be formed in order to help protect the underlying structures. In an embodiment the second passivation layer 153 may be similar to the first passivation layer 145, such as being a dielectric material dispensed using a spin-on process. However, any suitable process may be utilized.

Additionally, once the second passivation layer 153 has been formed, the second passivation layer 153 may be patterned in order to expose the first upper antenna layer 151 for operation. In an embodiment the second passivation layer 153 may be patterned utilizing, e.g., a photolithographic masking and etching process. However, any suitable method may be utilized.

The second antenna structure 139 may be similar to the first antenna structure 137. For example, the second antenna structure 139 may similarly comprise a second antenna substrate 161 (similar to the first antenna substrate 141), a third redistribution layer 163 (similar to the second redistribution layer 143 and also with a grounded element), a third passivation layer 165 (similar to the first passivation layer 145), third external connections 167 (similar to the second external connections 147), a second feeding element 169 (similar to the feeding element 149), a second upper antenna layer 177 (similar to the first upper antenna layer 151), and a fourth passivation layer 175 (similar to the second passivation layer 153). However, any suitable structures may be utilized.

Figure 1D:
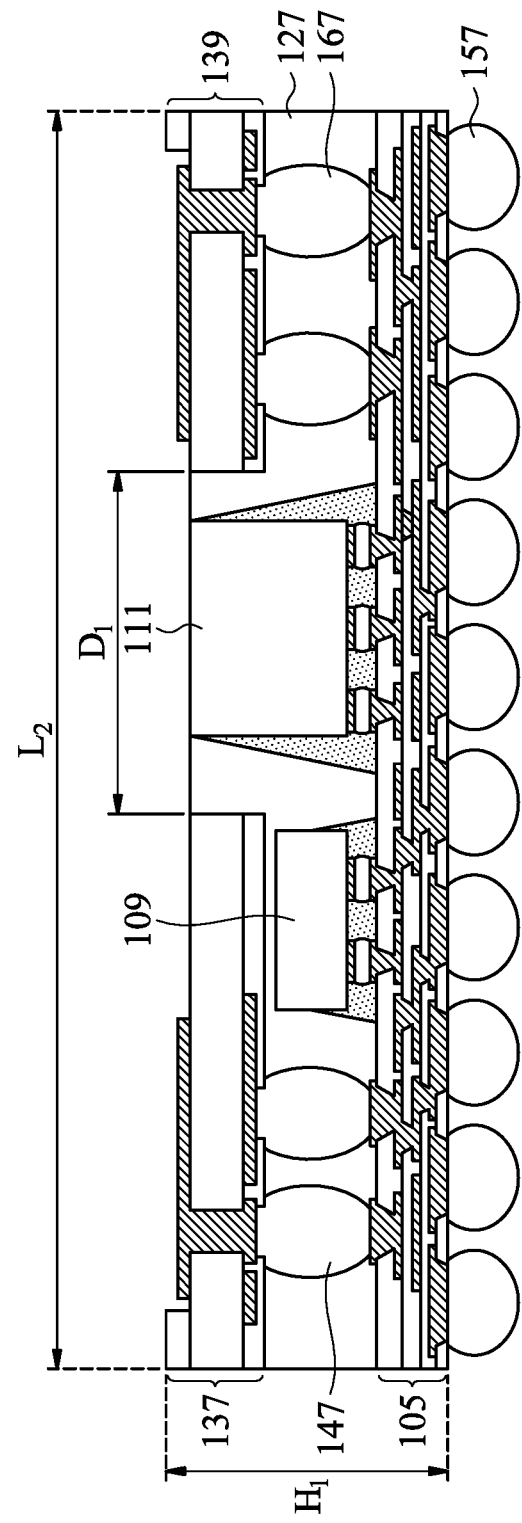

FIG. 1D illustrates a placement of the first antenna structure 137 and the second antenna structure 139 into electrical connection with the first redistribution layers 105. In an embodiment the second external connections 147 (on the first antenna structure 137) and the third external connections 167 (on the second antenna structure 139) into physical contact with the first redistribution layers 105 using, e.g., a pick and place process. Once in physical contact, a reflow process may be utilized to bond the first antenna structure 137 and the second antenna structure 139 to the first redistribution layers 105.

Additionally, the first antenna structure 137 and the second antenna structure 139 may be placed so as leave an opening between them for the second semiconductor device 111. In particular, while the first antenna structure 137 may extend over the first semiconductor device 109, the second semiconductor device 111 may extend into the opening between the first antenna structure 137 and the second antenna structure 139. As such, in an embodiment the first antenna structure 137 may be spaced apart from the second antenna structure 139 a first distance $D_1$ of between about 4 mm and about 10 mm, such as about 8 mm. However, any suitable dimensions may be utilized.

In another embodiment, the first antenna structure 137 and the second antenna structure 139 may be formed as a single structure. In this embodiment the opening may be formed through the structure such that the single structure surrounds the opening. In this embodiment the opening may have the first distance $D_1$, although any suitable dimensions for the opening that allows for the extension of the second semiconductor device 111 may be utilized.

Once the first antenna structure 137 and the second antenna structure 139 have been connected to the first redistribution layers 105, the first antenna structure 137, the second antenna structure 139, the first semiconductor device 109 and the second semiconductor device 111 may be encapsulated with an encapsulant 127. In an embodiment the encapsulant 127 may be a molding compound and may be placed using a molding device. For example, the carrier substrate 101 may be placed within a cavity of the molding device, and the cavity may be hermetically sealed. The encapsulant 127 may be placed within the cavity either before the cavity is hermetically sealed or else may be injected into the cavity through an injection port. In an embodiment the encapsulant 127 may be a molding compound resin such as polyimide, PPS, PEEK, PES, a heat resistant crystal resin, combinations of these, or the like.

Once the encapsulant 127 has been placed into the cavity such that the encapsulant 127 encapsulates the regions between the first antenna structure 137, the second antenna structure 139, the first semiconductor device 109 and the second semiconductor device 111, the encapsulant 127 may be cured in order to harden the encapsulant 127 for optimum protection. While the exact curing process is dependent at least in part on the particular material chosen for the encapsulant 127, in an embodiment in which molding compound is chosen as the encapsulant 127, the curing could occur through a process such as heating the encapsulant 127 to between about 100° C. and about 130° C., such as about 125° C. for about 60 sec to about 3000 sec, such as about 600 sec. Additionally, initiators and/or catalysts may be included within the encapsulant 127 to better control the curing process.

However, as one having ordinary skill in the art will recognize, the curing process described above is merely an exemplary process and is not meant to limit the current embodiments. Other curing processes, such as irradiation with an ultraviolet radiation or even allowing the encapsulant 127 to harden at ambient temperature, may be used. Any suitable curing process may be used, and all such processes are fully intended to be included within the scope of the embodiments discussed herein.

FIG. 1D also illustrates a debonding of the carrier substrate 101 and a placement of fourth external connections 157. In an embodiment the carrier substrate 101 may be debonded from the structure including the first semiconductor device 109 using, e.g., a thermal process to alter the adhesive properties of the adhesive layer 103. In a particular embodiment an energy source such as an ultraviolet (UV) laser, a carbon dioxide ($CO_2$) laser, or an infrared (IR) laser, is utilized to irradiate and heat the adhesive layer 103 until the adhesive layer 103 loses at least some of its adhesive properties. Once performed, the carrier substrate 101 and the adhesive layer 103 may be physically separated and removed from the structure.

The fourth external connections 157 may be formed or placed in electrical connection with the first redistribution layers 105 may be a ball grid array (BGA) which comprises a eutectic material such as solder, although any suitable materials may be used. In an embodiment in which the fourth external connections 157 are solder balls, the fourth external connections 157 may be formed using a ball drop method, such as a direct ball drop process. In another embodiment, the solder balls may be formed by initially forming a layer of tin through any suitable method such as evaporation, electroplating, printing, solder transfer, and then performing a reflow in order to shape the material into the desired bump shape. Once the fourth external connections 157 have been formed, a test may be performed to ensure that the structure is suitable for further processing.

Once the fourth external connections 157 have been formed or placed, the structure may be singulated into a discrete package. In an embodiment the structure may be singulated using one or more saw blades that separate the structure into discrete pieces. However, any suitable method of singulation, including laser ablation or one or more wet etches, may also be utilized.

By forming the structure as described, the first antenna structure 137 and the second antenna structure 139 may be integrated into a smaller structure for a lower cost. For example, by integrating the first antenna structure 137 and the second antenna structure 139 along with the first semiconductor device 109 and the second semiconductor device 111, the overall structure can be formed to have smaller dimensions. In a particular embodiment the overall structure may have a second length $L_2$ of between about 5 mm and about 20 mm, such as about 13 mm, and may have a second width $W_2$ (not separately illustrated as it extends into and out of the Figure) of between about 5 mm and about 20 mm, such as about 13 mm. Additionally, the overall height of the package may be reduced by about 20% from the use of flip chips, and may have a first height $H_1$ (excluding the fourth external connections 157) of between about 350 μm and about 1.2 mm, such as about 1.1 mm. However, any suitable dimensions may be utilized.

Additionally in this embodiment, the second semiconductor device 111 remains exposed and uncovered by the first antenna structure 137 and the second antenna structure 139. By remaining uncovered, heat that is generated by the second semiconductor device 111 has a direct path outside of the structure and is unimpeded by other materials. As such, heat can be more easily dissipated allowing for better operation.

Figure 1E:
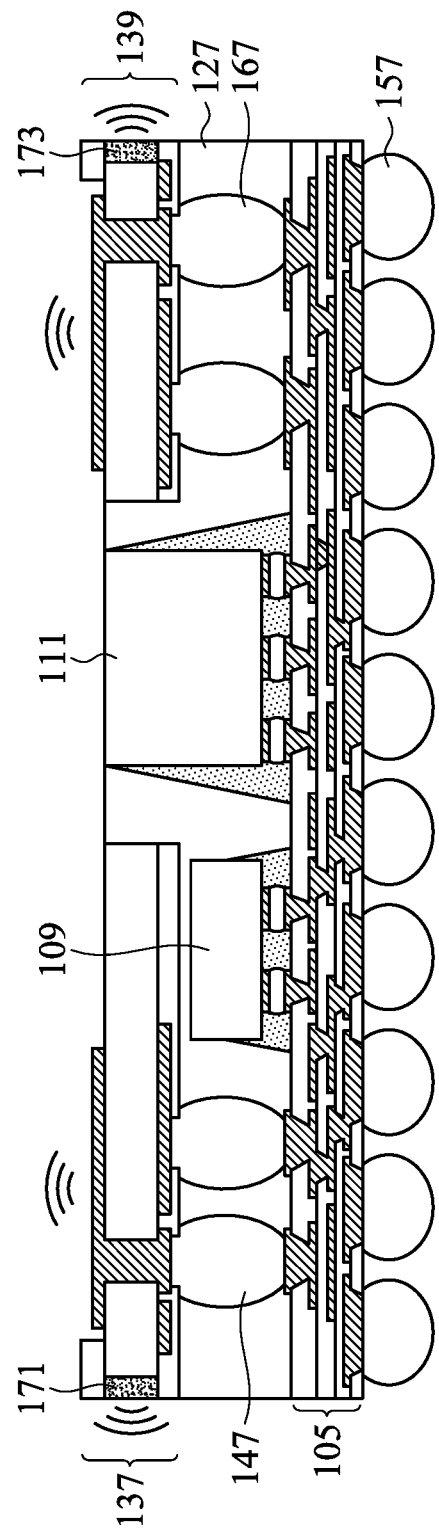

FIG. 1E illustrates another embodiment in which the first antenna structure 137 and the second antenna structure 139 comprise antennas not only on those surfaces facing away from the first redistribution layers 105 (as described above with respect to FIGS. 1A-1D), but also comprise a third antenna 171 formed along the external sidewalls of the first antenna structure 137 and a fourth antenna 173 formed along the external sidewalls of the second antenna structure 139. By utilizing multiple antennas at different orientations, a dipole may be utilized to enhance the sending/receiving capabilities of the overall device.

In an embodiment the third antenna 171 and the fourth antenna 173 may each comprise an upper antenna layer (connected to a corresponding feedline through the second redistribution layer 143) similar to the first upper antenna layer 151 and the second upper antenna layer 171 as well as a ground plane (connected to ground through the second redistribution layer 143). Each of the upper antenna layers and each of their corresponding ground planes may be formed within the first antenna substrate 141 using processes similar to the processes described above with respect to the feeding element 149. For example, openings may be made within the first antenna substrate 141, those openings may be filled with conductive material, and then planarization processes may be used to embed the conductive material within the first antenna substrate 141. However, any suitable methods may be utilized.

In another embodiment the third antenna 171 and the fourth antenna 173 may be formed simultaneously with the conductive tracing or routing built within the first antenna substrate 141. For example, when multiple layers of the conductive tracing and dielectric materials are formed, portions of the third antenna 171 and the fourth antenna 173 may be formed with the conductive tracing. However, any suitable method for manufacturing the third antenna 171 and the fourth antenna 173 may be utilized.

By forming the third antenna 171 and the fourth antenna 173 as described, each of the first antenna structure 137 and the second antenna structure 139 may comprise multiple antennas with multiple positions and orientations. For example, the third antenna 171 may have an upper antenna layer that is oriented at a right angle to the first upper antenna layer 151. By using multiple antennas and multiple orientations, the sending and receiving of signals may be enhanced.

Figure 1F:
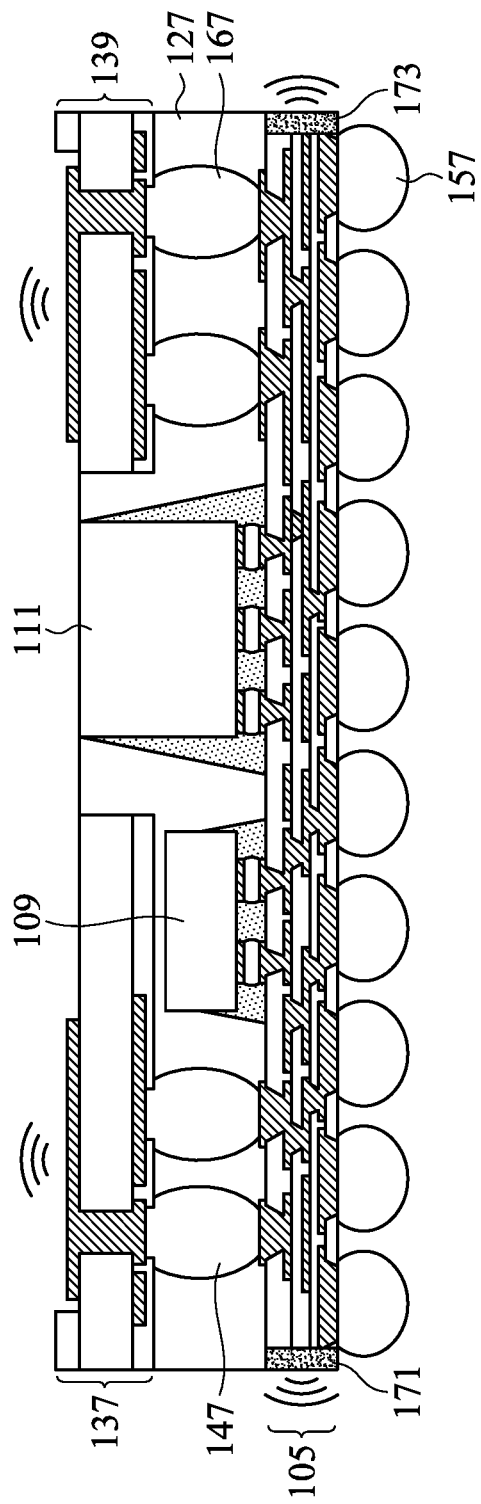

FIG. 1F illustrates yet another embodiment which utilizes multiple antennas with multiple orientations. In this embodiment, however, instead of (or in addition to) the third antenna 171 and the fourth antenna 173 being formed within the first antenna structure 137 and the second antenna structure 139, the third antenna 171 and the fourth antenna 173 are formed within the first redistribution layers 105. In this embodiment the upper antenna layers and ground planes of the third antenna 171 and the fourth antenna 173 may be formed at the same time and in the same fashion as each of the first redistribution layers 105 using, e.g., a series of seed layers and plating processes which are used to build up successive layers of conductive and dielectric material to form the upper antenna layers and the ground planes. However, any suitable method of manufacturing the upper antenna layers and ground planes of the third antenna 171 and the fourth antenna 173 may be utilized.

Additionally in this embodiment the upper antenna layers of the third antenna 171 and the fourth antenna 173 may be connected to the first semiconductor device 109 and the second semiconductor device 111 through the first redistribution layers 105 without having to travel through the second external connections 147 and the third external connections 167. Similarly, the ground planes of the third antenna 171 and the fourth antenna 173 may also be connected to ground through the first redistribution layers 105 without having to travel through the second external connections 147 and the third external connections 167. Such connections help to reduce the signal path and allow for a more efficient signal transmission.

Figure 1G:
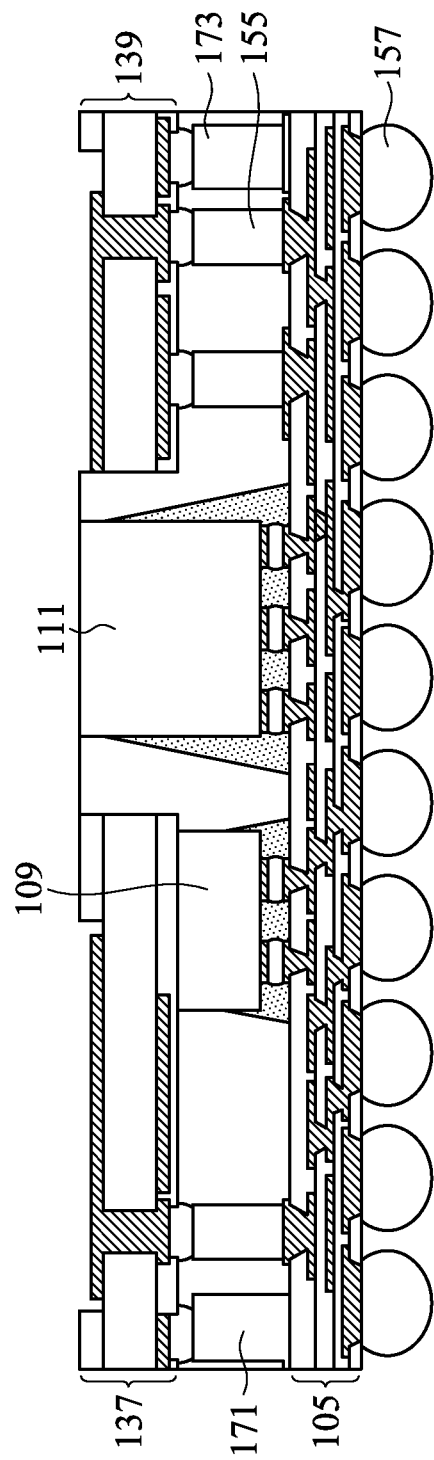

FIG. 1G illustrates another embodiment in which conductive pillars 155 are utilized to help connect the first redistribution layers 105 to the first antenna structure 137 and the second antenna structure 139. In an embodiment the conductive pillars 155 may be formed prior to placement of the first antenna structure 137 and the second antenna structure 139, and may be initiated by forming a seed layer in electrical connection with the first redistribution layers 105. A photoresist may then be placed over the seed layer and patterned where the conductive pillars 155 are desired to be formed, and a plating process is utilized to plate and deposit a conductive material such as copper onto the exposed portions of the seed layer. Once formed, the photoresist may be removed, and the exposed portions of the seed layer (e.g., those portions not covered by the conductive material) is removed using an etching process.

Additionally during the process to form the conductive pillars 155, the third antenna 171 and the fourth antenna 173 may also be formed to be located between the first redistribution layers 105 and the first antenna structure 137 and the second antenna structure 139. In particular, when the photoresist is patterned to form openings for the plating process, the photoresist may also be patterned in order to form openings in the desired shape and dimensions for the placement of the third antenna 171 and the fourth antenna 173. Once the openings have been formed, the material of the third antenna 171 and the fourth antenna 173 may be plated onto the seed layer along with the conductive material of the conductive pillars 155, the photoresist may be removed, and the seed layer may be etched. However, any suitable method of forming the third antenna 171 and the fourth antenna 173 may be utilized. In some embodiments, the third antenna 171 and the fourth antenna 173 of the first antenna structure 137 and the second antenna structure 139 may be connected to first redistribution layers 105 through third antenna 171 and the fourth antenna 173 that are located between the first redistribution layers 105 and the first antenna structure 137 and the second antenna structure 139 to form larger sidewall antenna (not shown in figure).

By utilizing the embodiments described herein, the fan out ratio constraints for antenna structures can be removed while still maintaining good package warpage characteristics.

FIGS. 2A-2D illustrate another embodiment in which the first antenna structure 137 is utilized along with thermal vias 201 which extend through the first antenna structure 137 in order to provide additional heat transfer capabilities and which may or may not be electrically isolated from the rest of the structures. Looking first at FIG. 2A, there is illustrated the first semiconductor device 109 already bonded to the first redistribution layers 105 as described above with respect to FIG. 1B. However, as illustrated, in one embodiment only a single first semiconductor device 109 (with all of the desired functionalities formed within the single first semiconductor device 109) is utilized, while in other embodiments, two semiconductor devices (e.g., the first semiconductor device 109 and the second semiconductor device 111 as illustrated in FIG. 1B) or more semiconductor devices may be utilized. Any suitable number of semiconductor devices may be used to obtain any desired functionality.

Figure 2A:
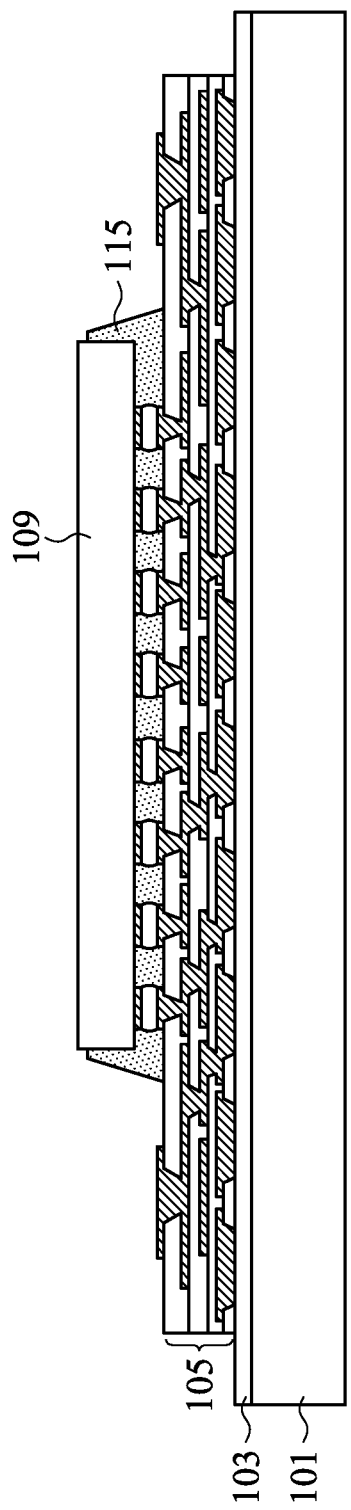
Figure 2B:
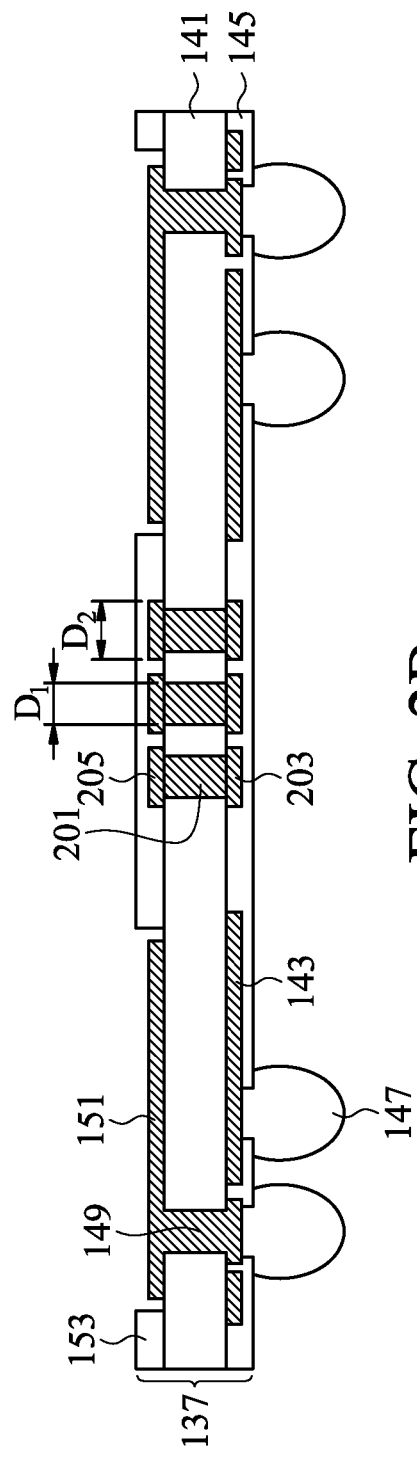

FIG. 2B illustrates a formation of the first antenna structure 137 along with the thermal vias 201 extending through the first antenna substrate 141. In an embodiment the first antenna substrate 141, the second redistribution layer 143, the first passivation layer 145 over the second redistribution layer 143, the second external connections 147, the feeding element 149, the first upper antenna layer 151, and the second passivation layer 153 may be formed as described above with respect to FIG. 1C. However, any suitable method may be utilized.

Additionally in this embodiment, during the formation of the feeding element 149, the thermal vias 201 may also be formed. In particular, the thermal vias 201 may be formed simultaneously with and utilizing the same processes as the feeding elements 149, such as by forming an opening, filling the opening with conductive material, and then planarizing the conductive material to form the thermal vias 201. However, any suitable method of manufacturing the thermal vias 201 may be utilized.

In an embodiment the thermal vias 201 are sized in order to help remove thermal buildup from the heat generated by the first semiconductor device 109. As such, the thermal vias 201 may be formed to have a first diameter $D_1$ of between about 50 µm and about 300 µm, such as about 150 µm. However, any suitable dimensions may be utilized.

Also in this embodiment, first thermal caps 203 and second thermal caps 205 may be formed in thermal and physical connection with the thermal vias 201 that extend through the first antenna substrate 141. In an embodiment the first thermal caps 203 may be formed simultaneously with and using similar processes as the second redistribution layer 143. For example, a seed layer may be formed and covered to provide a pattern, and a plating process may then be utilized to form both the second redistribution layer 143 as well as the first thermal caps 203. However, any suitable process may be utilized to form the first thermal caps 203.

Similarly, the second thermal caps 205 may be formed simultaneously with and using similar processes as the first upper antenna layer 151. For example, a seed layer may be formed and covered to provide a pattern, and a plating process may then be utilized to simultaneously form both the first upper antenna layer 151 as well as the second thermal caps 205. However, any suitable process may be utilized to form the second thermal caps 205.

The first thermal caps 203 and the second thermal caps 205 may be formed to have larger dimensions than the thermal vias 201 in order to enhance the collection and dispersal of heat. As such, in one embodiment the first thermal caps 203 and the second thermal caps 205 may be formed to have a second diameter $D_2$ of between about 100 µm and about 350 µm, such as about 200 µm. However, any suitable dimensions may be utilized.

Once the thermal vias 201, the first thermal caps 203 and the second thermal caps 205 are formed, the first passivation layer 145 may be placed over both the second redistribution layer 143 and the first thermal caps 203. Additionally, the first passivation layer 145 may be patterned to expose portions of the second redistribution layer 143 for connection to the second external connections 147, and the second external connections 147 may be placed. In some embodiments the first passivation layer 145 is left covering the first thermal caps 203, while in other embodiments the first passivation layer 145 may be patterned to expose some or all of the first thermal caps 203.

Also, the second passivation layer 153 may be placed to cover the first upper antenna layer 151 as well as the second thermal caps 205. In an embodiment the second passivation layer 153 may then be patterned in order to expose the first upper antenna layer 151 while leaving the second thermal caps 205 covered. In other embodiments the second passivation layer 153 may be patterned to expose some or all of the second thermal caps 205.

FIG. 2C illustrates that, once the first antenna structure 137 has been formed with the thermal vias 201, the first antenna structure 137 may be bonded to the first redistribution layers 105. In an embodiment the first antenna structure 137 may be bonded and encapsulated as described above with respect to FIG. 1D. For example, the first antenna structure 137 may be positioned and then a reflow process may be utilized to bond the first antenna structure 137 to the first redistribution layers 105. However, any suitable process may be utilized.

Additionally, once the first antenna structure 137 has been bonded, the first semiconductor device 109 may be encapsulated with the encapsulant 127. In an embodiment the first semiconductor device 109 may be encapsulated as described above with respect to FIG. 1D. For example, the carrier substrate 101 may be placed within a molding chamber, and the encapsulant 127 dispensed and cured. However, any suitable process may be utilized.

FIG. 2C additionally illustrates that, once the encapsulant 127 has been placed and cured, the carrier substrate 101 may be removed and the fourth external connections 157 placed. In an embodiment the carrier substrate 101 may be removed and the fourth external connections 157 placed as described above with respect to FIG. 1D. However, any suitable process may be utilized.

Once the encapsulant 127 has been placed and cured, the structure may be singulated into a discrete package. In an embodiment the structure may be singulated using one or more saw blades that separate the structure into discrete pieces. However, any suitable method of singulation, including laser ablation or one or more wet etches, may also be utilized.

By forming the thermal vias 201, the operation of the first semiconductor device 109 and, as such, the whole device may be improved. In particular, by providing a thermal path for heat generated by the first semiconductor device 109 to be removed, there will be less heat buildup within the package, thereby helping efficiency and also helping to prevent thermal failure.

FIG. 2D illustrates another embodiment in which the second semiconductor device 111 is utilized along with the first semiconductor device 109. However, in this embodiment, instead of the second semiconductor device 111 extending through the first antenna structure 137 (and/or the second antenna structure 139) to radiate its own heat, the first antenna structure 137 may extend over both the first semiconductor device 109 as well as the second semiconductor device 111. As such, in order to help remove heat from the second semiconductor device 111, the thermal vias 201 (along with the first thermal cap 203 and the second thermal caps 205) may be formed and placed so that the thermal vias 201 are located over the second semiconductor device 111 so as to help remove heat generated by the second semiconductor device 111.

Figure 2E:
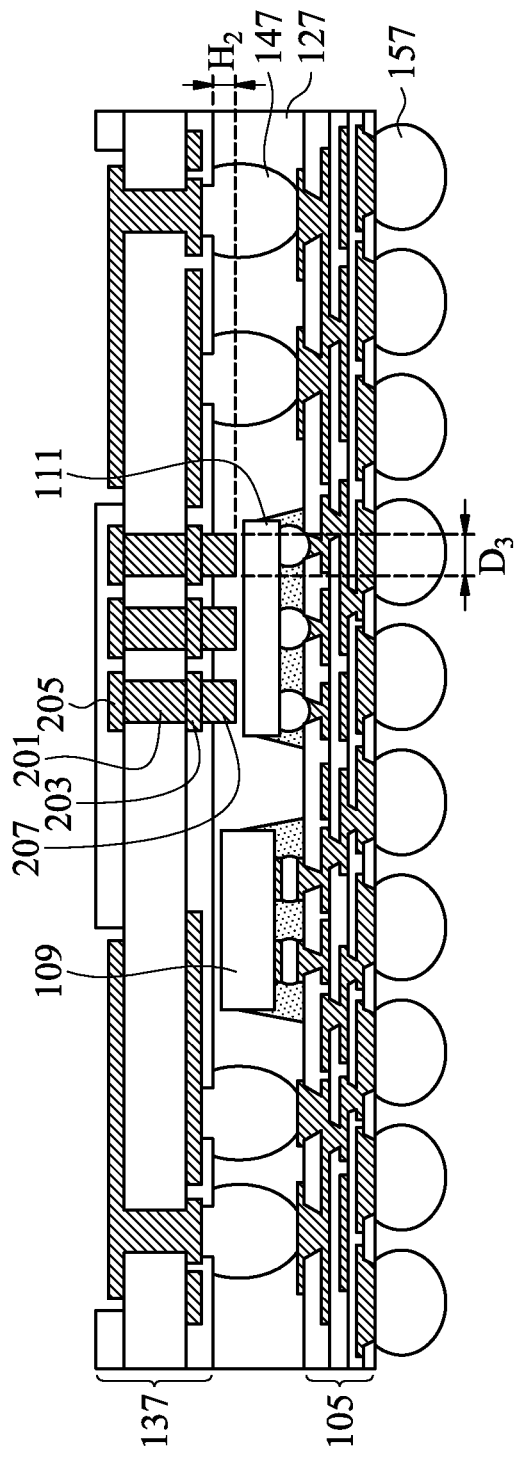

FIG. 2E illustrates another embodiment in which thermal pillars 207 are utilized along with the thermal vias 201, first thermal caps 203 and second thermal caps 205 in order to help remove an even larger amount of heat from the second semiconductor device 111. In an embodiment the thermal pillars 207 may be a thermally conductive material such as a metal like copper. However, any suitable material may be utilized.

In an embodiment the thermal pillars 207 may be formed after the formation of the first passivation layer 145 over the second redistribution layer 143. In this embodiment the first passivation layer 145 may be patterned using, e.g., a photolithographic masking and etching process in the desired shape of the thermal pillars 207 to expose the underlying first thermal caps 203. Once the first passivation layer 145 has been patterned, a plating process may be utilized to fill the openings within the first passivation layer 145 and the photoresist to form the thermal pillars 207, after which the photoresist may be removed using a process such as ashing.

In an embodiment the thermal pillars 207 are sized to remove heat from the second semiconductor device 111. In some embodiment the thermal pillars 207 are located to remove heat from the second semiconductor device 111, such as by being either in physical contact with the second semiconductor device 111 or in thermal connection with the second semiconductor device 111. In an embodiment the thermal pillars 207 may have a third diameter $D_3$ of between about 50 µm and about 300 µm, such as about 150 µm. Additionally, the thermal pillars 207 may be formed to extend away from the first passivation layer 145 a second height $H_2$ of between about 10 µm and about 60 µm, such as about 15 µm. However, any suitable dimensions may be utilized.

Once the thermal pillars 207 have been formed, the remainder of the first antenna structure 137 may be completed, and the first antenna structure 137 may be bonded to the first redistribution layers 105 as described above with respect to FIG. 1D. Additionally, the encapsulant 127 may be placed between the first semiconductor device 109, the second semiconductor device 111 and the first antenna structure 137, with the encapsulant 127 making physical contact with the thermal pillars 207.

Figure 2F:
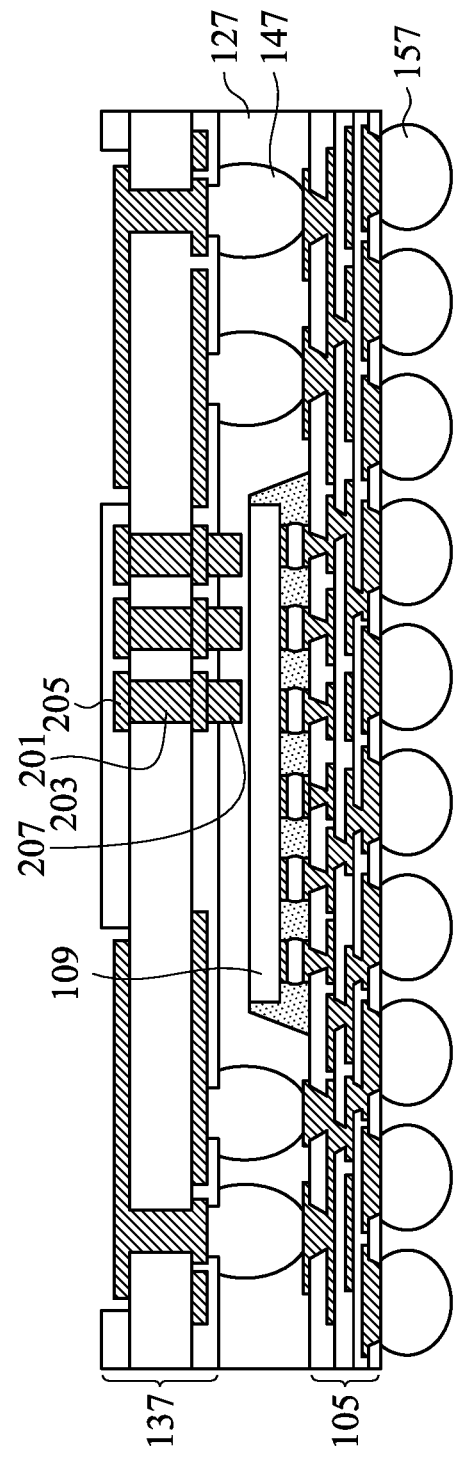

FIG. 2F illustrates yet another embodiment which utilizes the thermal pillars 207 but in which the first semiconductor device 109 is utilized without the second semiconductor device 111. For example, the first semiconductor device 109 may be a combination device in which the functionalities of the second semiconductor device 111 are incorporated within the first semiconductor device 109 to form a combination device. In this embodiment, the thermal pillars 207 are formed and then placed so as to be located over the first semiconductor device 109. As such, the thermal pillars 207 can be used to extract heat generated from the first semiconductor device 109.

FIGS. 3A-3F illustrate another embodiment in which vias 301 are formed prior to the formation of the first redistribution layers 105 in an integrated fan out (InFO) package. In this embodiment instead of forming the first redistribution layers 105 on the adhesive layer 103 over the carrier substrate 101, a polymer layer 303 and a first seed layer 305 are formed over the adhesive layer 103. In an embodiment the polymer layer 303 may be polybenzoxazole (PBO), although any suitable material, such as polyimide or a polyimide derivative, Solder Resistance (SR), or Ajinomoto build-up film (ABF) may be utilized. The polymer layer 303 may be placed using, e.g., a spin-coating process to a thickness of between about 2 µm and about 15 µm, such as about 5 µm, although any suitable method and thickness may be used.

The first seed layer 305 is formed over the polymer layer 303. In an embodiment the first seed layer 305 is a thin layer of a conductive material that aids in the formation of a thicker layer during subsequent processing steps. The first seed layer 305 may comprise a layer of titanium about 1,000 Å thick followed by a layer of copper about 5,000 Å thick. The first seed layer 305 may be created using processes such as sputtering, evaporation, or PECVD processes, depending upon the desired materials. The first seed layer 305 may be formed to have a thickness of between about 0.3 µm and about 1 µm, such as about 0.5 µm.

Once the first seed layer 305 has been formed, a photoresist may be placed and patterned over the first seed layer 305. In an embodiment the photoresist may be placed on the first seed layer 305 using, e.g., a spin coating technique to a height of between about 50 µm and about 250 µm, such as about 120 µm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern.

In an embodiment the pattern formed into the photoresist is a pattern for vias 301. The vias 301 are formed in such a placement as to be located on different sides of subsequently attached devices such as the first semiconductor device 109 and the second semiconductor device 111 (if present). However, any suitable arrangement for the pattern of vias 301, such as by being located such that the first semiconductor device 109 and the second semiconductor device 111 are placed on opposing sides of the vias 301, may be utilized.

In an embodiment the vias 301 are formed within the photoresist. In an embodiment the vias 301 comprise one or more conductive materials, such as copper, tungsten, other conductive metals, or the like, and may be formed, for example, by electroplating, electroless plating, or the like. In an embodiment, an electroplating process is used wherein the first seed layer 305 and the photoresist are submerged or immersed in an electroplating solution. The first seed layer 305 surface is electrically connected to the negative side of an external DC power supply such that the first seed layer 305 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 305, acquires the dissolved atoms, thereby plating the exposed conductive areas of the first seed layer 305 within the opening of the photoresist.

Once the vias 301 have been formed using the photoresist and the first seed layer 305, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may be utilized. The removal of the photoresist may expose the underlying portions of the first seed layer 305.

Once exposed a removal of the exposed portions of the first seed layer 305 may be performed. In an embodiment the exposed portions of the first seed layer 305 (e.g., those portions that are not covered by the vias 301) may be removed by, for example, a wet or dry etching process. For example, in a dry etching process reactants may be directed towards the first seed layer 305 using the vias 301 as masks. In another embodiment, etchants may be sprayed or otherwise put into contact with the first seed layer 305 in order to remove the exposed portions of the first seed layer 305. After the exposed portion of the first seed layer 305 has been etched away, a portion of the polymer layer 303 is exposed between the vias 301.

Figure 3A:
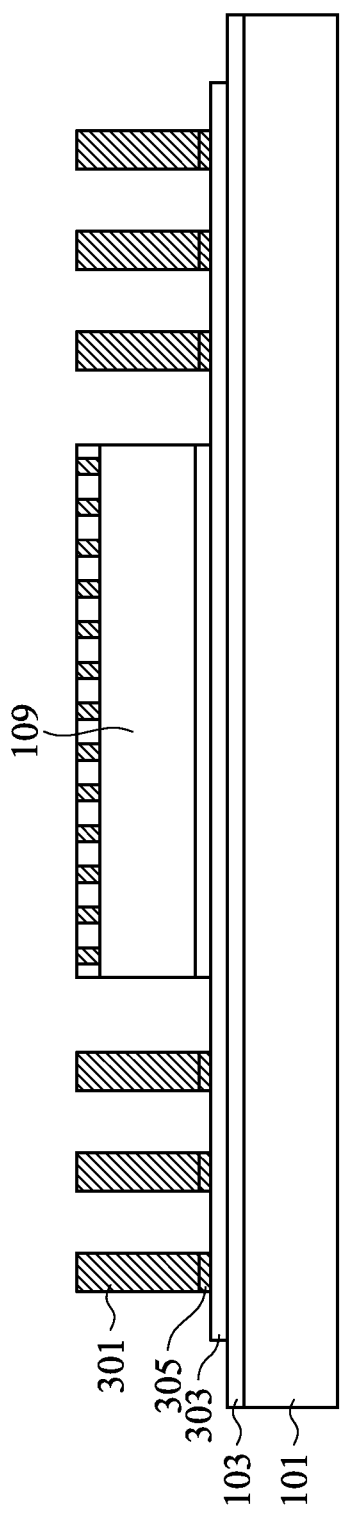
FIGS. 3A-3G illustrate vias incorporated into the integrated fan out structure in accordance with some embodiments.

FIG. 3A also illustrates a placement of the first semiconductor device 109 onto the polymer layer 303. In an embodiment the first semiconductor device 109 may be placed onto the polymer layer 303 using, e.g., a pick and place process, and may be held onto the polymer layer 303 using, e.g., a die attach film. However, any other method of placing the first semiconductor device 109 may also be utilized. In some embodiments the backside redistribution layer is formed on the polymer layer 303 (not shown) and then may be the ground plane or ground line for the first antenna structure 137. The backside redistribution layer may then be connected to the first redistribution layer 105 through first seed layer 305 and vias 301 and the first redistribution layer 105 can be used in order to provide electrical grounding to the first antenna structure 137.

Figure 3B:
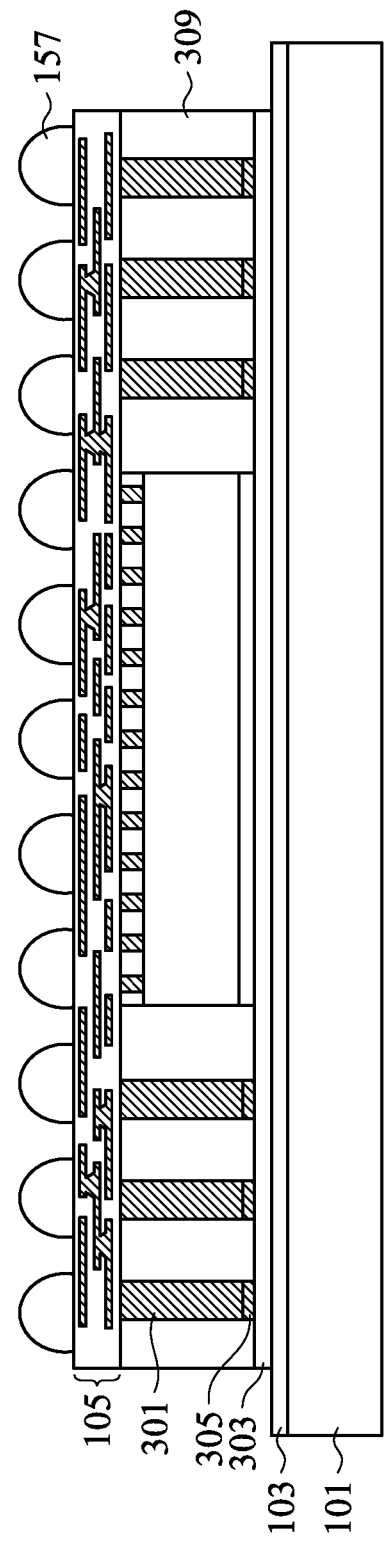

FIG. 3B illustrates an encapsulation of the vias 301 and the first semiconductor device 109. The encapsulation may be performed in a molding device, which may comprise a top molding portion and a bottom molding portion separable from the top molding portion. When the top molding portion is lowered to be adjacent to the bottom molding portion, a molding cavity may be formed for the carrier substrate 101, the vias 301 and the first semiconductor device 109.

During the encapsulation process the top molding portion may be placed adjacent to the bottom molding portion, thereby enclosing the carrier substrate 101, the vias 301, and the first semiconductor device 109 within the molding cavity. Once enclosed, the top molding portion and the bottom molding portion may form an airtight seal in order to control the influx and outflux of gasses from the molding cavity. Once sealed, an encapsulant 309 may be placed within the molding cavity. The encapsulant 309 may be a molding compound resin such as polyimide, PPS, PEEK, PES, a heat resistant crystal resin, combinations of these, or the like. The encapsulant 309 may be placed within the molding cavity prior to the alignment of the top molding portion and the bottom molding portion, or else may be injected into the molding cavity through an injection port.

Once the encapsulant 309 has been placed into the molding cavity such that the encapsulant 309 encapsulates the carrier substrate 101, the vias 301, and the first semiconductor device 109, the encapsulant 309 may be cured in order to harden the encapsulant 309 for optimum protection. While the exact curing process is dependent at least in part on the particular material chosen for the encapsulant 309, in an embodiment in which molding compound is chosen as the encapsulant 309, the curing could occur through a process such as heating the encapsulant 309 to between about 100° C. and about 130° C., such as about 125° C. for about 60 sec to about 3000 sec, such as about 600 sec. Additionally, initiators and/or catalysts may be included within the encapsulant 309 to better control the curing process.

However, as one having ordinary skill in the art will recognize, the curing process described above is merely an exemplary process and is not meant to limit the current embodiments. Other curing processes, such as irradiation of an ultraviolet radiation or even allowing the encapsulant 309 to harden at ambient temperature, may be used. Any suitable curing process may be used, and all such processes are fully intended to be included within the scope of the embodiments discussed herein.

FIG. 3B also illustrates a thinning of the encapsulant 309 in order to expose the vias 301 and the first semiconductor device 109. The thinning may be performed, e.g., using a mechanical grinding or chemical mechanical polishing (CMP) process whereby chemical etchants and abrasives are utilized to react and grind away the encapsulant 309 and the first semiconductor device 109 until the vias 301 and the first external connectors (e.g., copper pillars surrounded by a dielectric layer) on the first semiconductor device 109 have been exposed. As such, the first semiconductor device 109 and the vias 301 may have a planar surface that is also coplanar with the encapsulant 309.

However, while the CMP process described above is presented as one illustrative embodiment, it is not intended to be limiting to the embodiments. Any other suitable removal process may be used to thin the encapsulant 309 and the first semiconductor device 109 and expose the vias 301. For example, a series of chemical etches may be utilized. This process and any other suitable process may be utilized to thin the encapsulant 309 and the first semiconductor device 109 and all such processes are fully intended to be included within the scope of the embodiments.

Once the encapsulant 309 is thinned and the vias 301 are exposed, the first redistribution layers 105 may be formed over and in electrical connection with the vias 301 and the first semiconductor device 109. In an embodiment the first redistribution layers 105 may be formed as described above with respect to FIG. 1A. For example, a seed layer may be formed and covered to provide a pattern, and a plating process may then be utilized to form the conductive portions of each layer of conductive material, which layer is then covered by an overlying dielectric layer. However, any suitable process for forming the first redistribution layers 105 may be utilized.

Additionally, once the first redistribution layers 105 has been formed the fourth external connections 157 may be placed or formed in contact with the first redistribution layers 105. In an embodiment the fourth external connections 157 may be formed as described above with respect to FIG. 1D. However, any suitable process and materials may be utilized to form the fourth external connections 157.

Figure 3C:
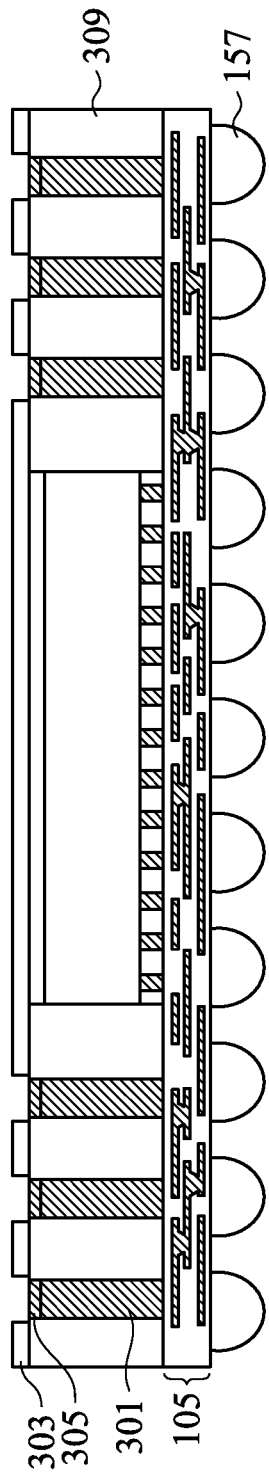

FIG. 3C illustrates a debonding of the carrier substrate 101, a patterning of the polymer layer 303. In an embodiment the carrier substrate 101 may be debonded from the structure including the first semiconductor device 109 using, e.g., a thermal process to alter the adhesive properties of the adhesive layer 103. In a particular embodiment an energy source such as an ultraviolet (UV) laser, a carbon dioxide ($CO_2$) laser, or an infrared (IR) laser, is utilized to irradiate and heat the adhesive layer 103 until the adhesive layer 103 loses at least some of its adhesive properties. Once performed, the carrier substrate 101 and the adhesive layer 103 may be physically separated and removed from the structure.

Once the carrier substrate 101 has been removed, the polymer layer 303 may be patterned in order to expose the vias 301 (along with the associated first seed layer 305). In an embodiment the polymer layer 303 may be patterned using, e.g., a laser drilling method. During the laser drilling process the drill energy may be in a range from 0.1 mJ to about 30 mJ, and a drill angle of about 0 degree (perpendicular to the polymer layer 303) to about 85 degrees to normal of the polymer layer 303. In an embodiment the patterning may be formed to form openings over the vias 301 to have a width of between about 100 μm and about 300 μm, such as about 200 μm.

In another embodiment, the polymer layer 303 may be patterned by initially applying a photoresist to the polymer layer 303 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 303 are removed with, e.g., a dry etch process. However, any other suitable method for patterning the polymer layer 303 may be utilized.

Figure 3D:
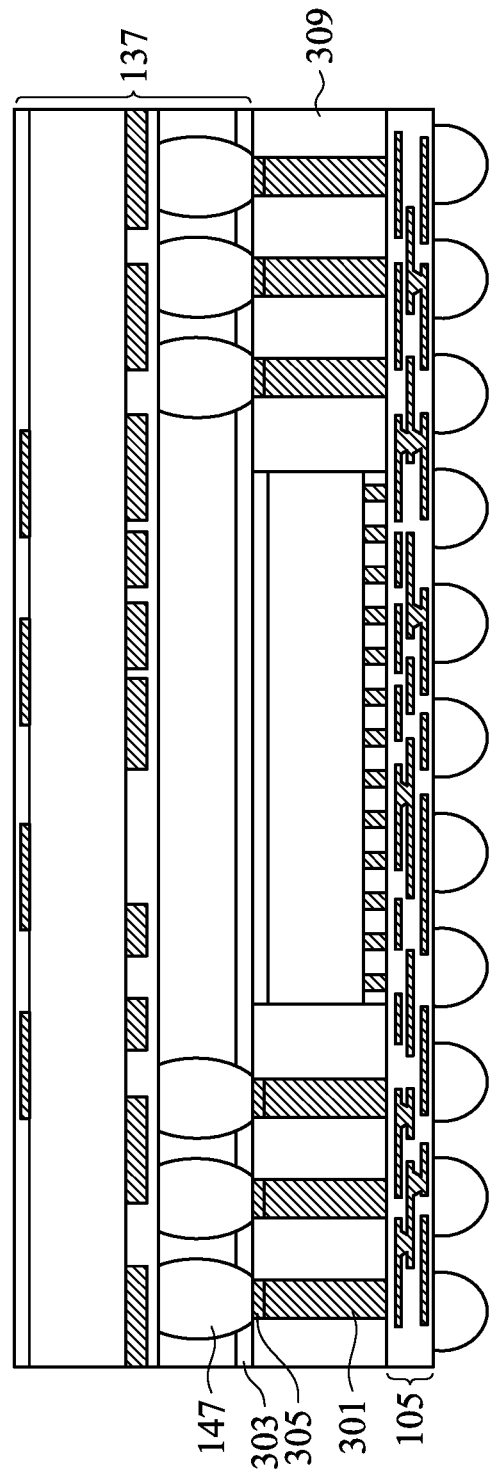

FIG. 3D illustrates that, once the vias 301 have been exposed, the first antenna structure 137 may be bonded to the vias 301. In an embodiment the first antenna structure 137 may be bonded to the vias 301 by aligning the second external connections 147 with the vias 301 and placing the second external connections 147 in physical contact with the vias 301 through the polymer layer 303. Once in physical contact, a reflow process may be utilized to bond the first antenna structure 137 to the vias 301. In some embodiments, the extra backside redistribution layers is formed on the polymer layer 303 before placing the first antenna structure 137 (not shown), and then this backside redistribution layer may be the ground plane or ground line for the first antenna structure 137. The backside redistribution layer may then be connected to the first redistribution layer 105 through first seed layer 305 and vias 301 and the first redistribution layer 105 can be used in order to provide electrical grounding to the first antenna structure 137.

FIG. 3D additionally illustrates the placement of an underfill material 307 between the first antenna structure 137 and the polymer layer 303. In an embodiment the underfill material 307 is a protective material used to cushion and support the first antenna structure 137 from operational and environmental degradation, such as stresses caused by the generation of heat during operation. The underfill material 307 may comprise, for example, a liquid epoxy or other protective material, and then cured to harden and may be dispensed by, e.g., injection.

FIG. 3D also illustrates a singulation of the structure into a discrete package. In an embodiment the structure may be singulated using one or more saw blades that separate the structure into discrete pieces. However, any suitable method of singulation, including laser ablation or one or more wet etches, may also be utilized.

Figure 3E:
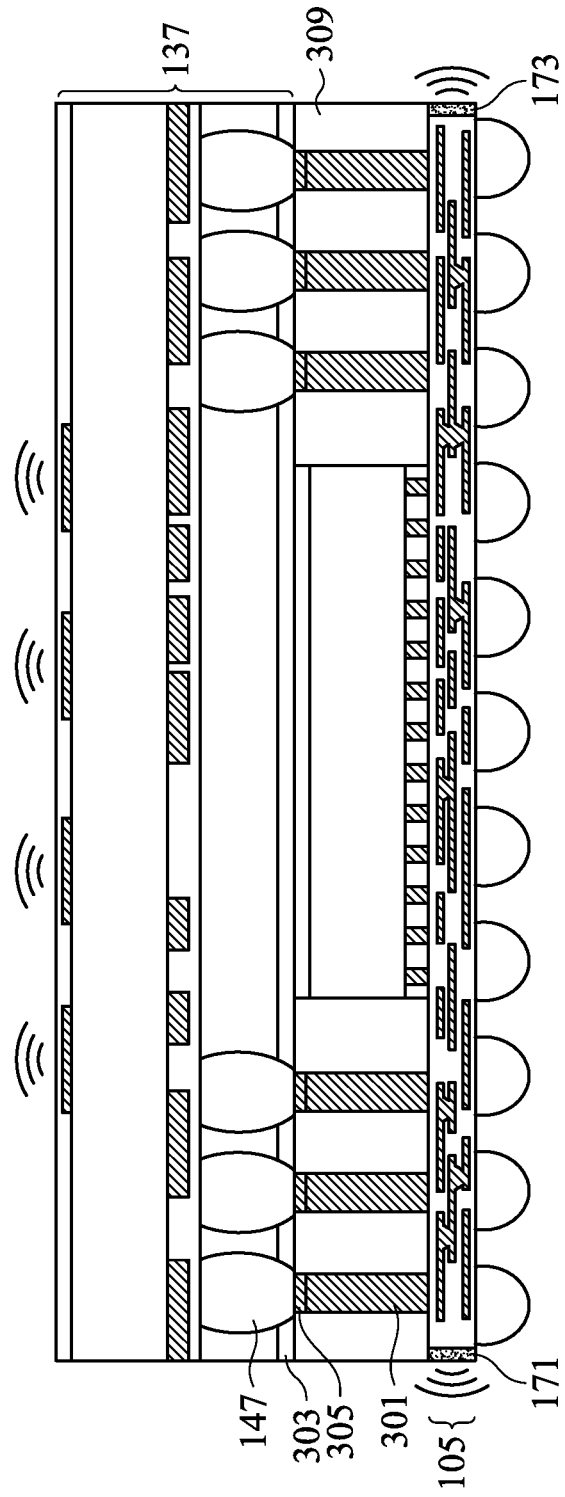

FIG. 3E illustrates another embodiment which utilizes multiple antennas with multiple orientations along with the vias 301. In this embodiment, however, instead of (or in addition to) the antenna being formed within the first antenna structure 137, the third antenna 171 and the fourth antenna 173 are formed within the first redistribution layers 105. In an embodiment the third antenna 171 and the fourth antenna 173 may be formed as described above with respect to FIG. 1F. For example, the third antenna 171 and the fourth antenna 173 may be formed at the same time and in the same fashion as each of the first redistribution layers 105 using, e.g., a series of seed layers and plating processes. However, any suitable method of manufacturing the third antenna 171 and the fourth antenna 173 may be utilized.

Figure 3F:
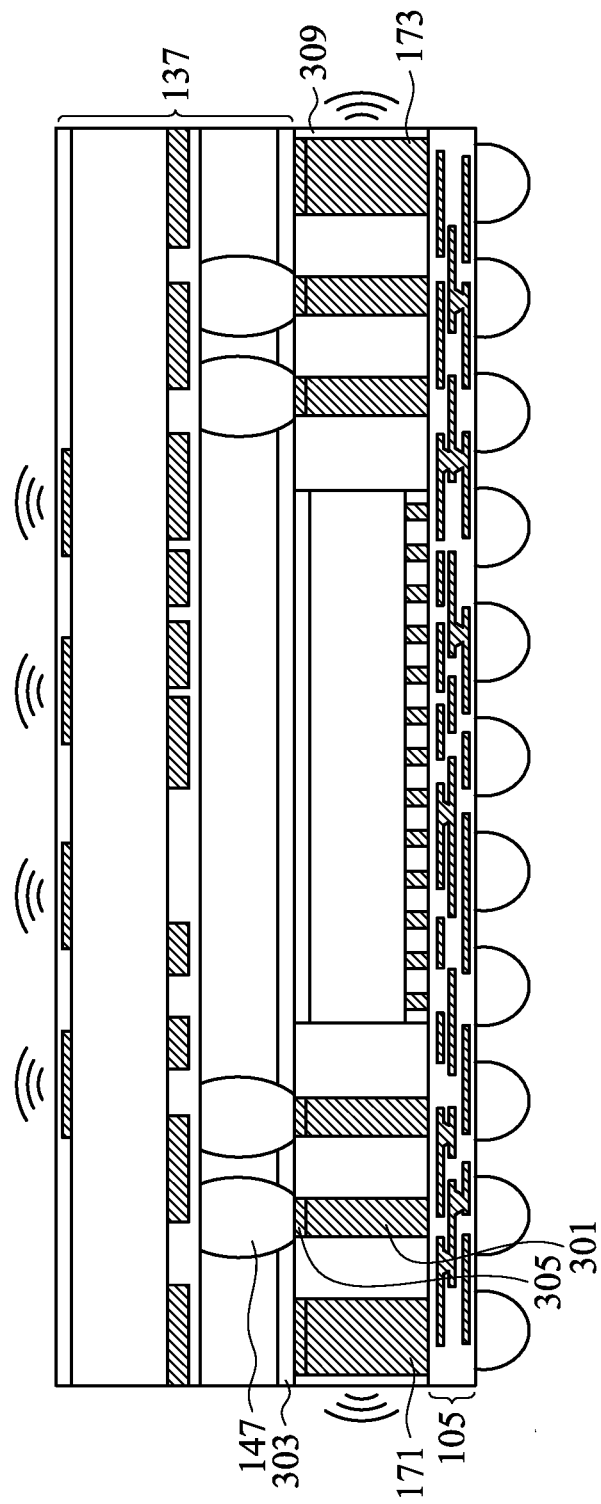

FIG. 3F illustrates yet another embodiment in which the third antenna 171 and the fourth antenna 173 are formed not within the first antenna structure 137 or the first redistribution layers 105, but are formed along with the vias 301. In particular, when the photoresist is patterned to form openings for the plating process, the photoresist may also be patterned in order to form openings in the desired shape and dimensions for the placement of the third antenna 171 and the fourth antenna 173. Once the openings have been formed, the material of the third antenna 171 and the fourth antenna 173 may be plated onto the seed layer along with the conductive material of the vias 301, the photoresist may be removed, and the seed layer may be etched. However, any suitable method of forming the third antenna 171 and the fourth antenna 173 may be utilized.

Figure 3G:
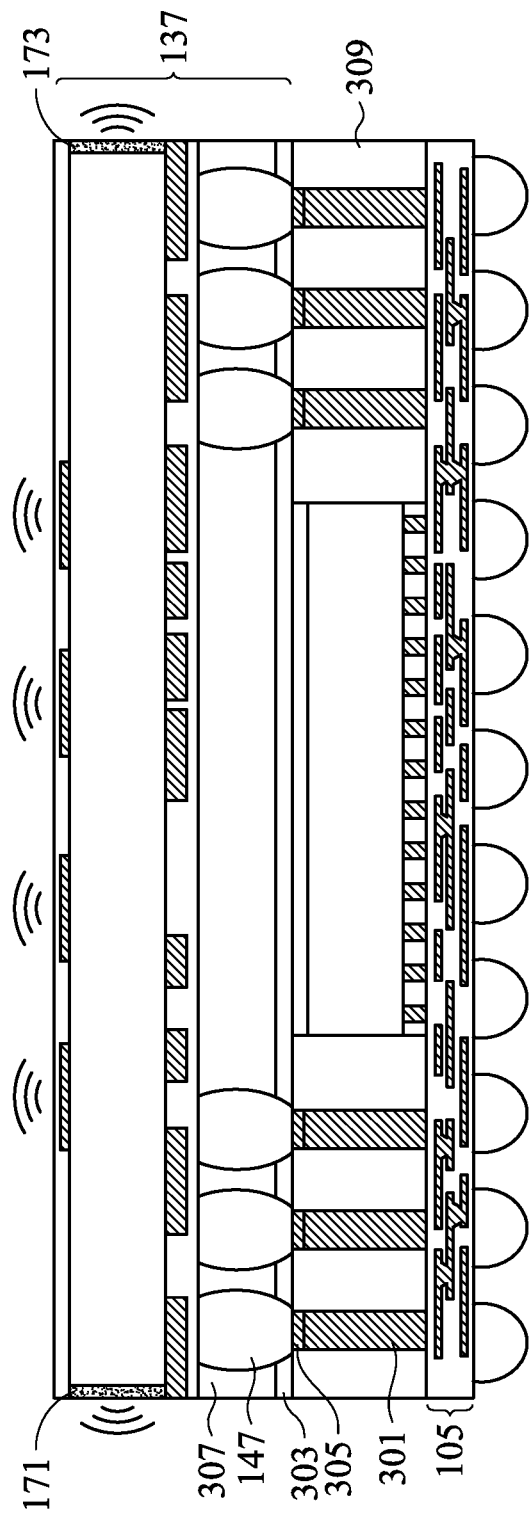

FIG. 3G illustrates yet another embodiment in which the third antenna 171 and the fourth antenna 173 are formed within the first antenna structure 137. In an embodiment the third antenna 171 and the fourth antenna 173 may be formed as described above with respect to FIG. 1E. For example, the structures of the third antenna 171 and the fourth antenna 173 may be formed simultaneously with either the feeding element 149 or the conductive traces formed within the first antenna substrate 141. However, any suitable manufacturing processes may be utilized to form the third antenna 171 and the fourth antenna 173.

By utilizing the embodiments described herein, a multi-layer antenna located on both the top surface and sidewalls of the overall structure is manufactured while still retaining a smaller form factor in each direction (e.g., the X, Y, and Z directions). Such antennas can be formed directly on the solder ball traces (SBT) without extra metallization or lithographic processes, thereby lowering costs by about 30% while also making layouts easier for customers. Further, by implementing the first redistribution layers 105 as connective paths, there can be a smaller redistribution path which leads to a better performance. Additionally, by including such structures as inductors within the first redistribution layers 105, an overall power savings of about 10% may be achieved while still maintaining a silicon area reduction of about 10%.

In accordance with an embodiment, a semiconductor device includes: redistribution structures connected to external connections; a first semiconductor device connected to the redistribution structures; an antenna substrate located on an opposite side of the first semiconductor device from the redistribution structures; and electrical connections separate from the first semiconductor device, the first semiconductor device being electrically connected to the antenna substrate through the redistribution structures and the electrical connections. In an embodiment the semiconductor device further includes an antenna structure located within the redistribution structures. In an embodiment the semiconductor device further includes an antenna structure located within the electrical connections. In an embodiment the semiconductor device further includes multiple antenna structures located within the antenna substrate. In an embodiment the semiconductor device further includes a thermal via extending through the antenna substrate. In an embodiment the electrical connections are through substrate vias. In an embodiment the first semiconductor device is a radio frequency chip.

In accordance with another embodiment, a method includes: forming a redistribution structure over a carrier wafer; attaching a first semiconductor device to the redistribution structure; electrically connecting an antenna substrate to the redistribution structure, wherein the first semiconductor device is located between the antenna substrate and the redistribution structure; and removing the carrier wafer. In an embodiment the forming the redistribution structure forms an antenna simultaneously within the redistribution structure. In an embodiment the first semiconductor device is a radio frequency chip. In an embodiment the electrically connecting the antenna substrate includes electrically connecting a first antenna layer and a second antenna layer to the redistribution structure, wherein the first antenna layer is oriented at a right angle to the second antenna layer. In an embodiment the method further includes encapsulating the first semiconductor device after the electrically connecting the antenna substrate to the redistribution structure. In an embodiment the electrically connecting the antenna substrate further includes: forming electrical connections separate from the first semiconductor device; and bonding the antenna substrate to the electrical connections. In an embodiment the forming the electrical connections forms an antenna simultaneously with the electrical connections.

In accordance with yet another embodiment, a method includes: forming through substrate vias over a polymer layer; attaching a first semiconductor device to the polymer layer; encapsulating the through substrate vias and the first semiconductor device with an encapsulant; planarizing the encapsulant until the first semiconductor device, the encapsulant, and the through substrate vias are planar with each other; forming a redistribution structure over the encapsulant, the through substrate vias, and the first semiconductor device; patterning the polymer layer after the forming the redistribution structure; and bonding an antenna substrate to the through substrate vias through the polymer layer. In an embodiment the forming the redistribution structure forms an antenna simultaneously with the redistribution structure. In an embodiment the forming the through substrate vias forms an antenna simultaneously with the through substrate vias. In an embodiment the first semiconductor device is a radio frequency chip. In an embodiment the antenna substrate has multiple upper antenna layers, each one of the multiple upper antenna layers being oriented in a different direction. In an embodiment the method further includes applying an underfill material between the antenna substrate and the polymer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a redistribution layer;
   after the forming the redistribution layer, attaching a first semiconductor die to the redistribution layer;
   forming a through via through an antenna substrate;
   electrically connecting the antenna substrate to the redistribution layer with a ball grid array, wherein after the electrically connecting the through via is located over the first semiconductor die; and
   forming a first thermal cap prior to the forming the through via, wherein after the forming the through via the through via is in physical contact with the first thermal cap.

2. The method of claim 1, further comprising attaching a second semiconductor die to the redistribution layer prior to the electrically connecting the antenna substrate.

3. The method of claim 1, wherein the first semiconductor die is the only semiconductor die attached to the redistribution layer during the electrically connecting the antenna substrate.

4. The method of claim 1, wherein the through via has a first diameter of between about 50 μm and about 300 μm.

5. The method of claim 4, wherein the first diameter is between about 50 µm and about 150 µm.

6. The method of claim 1, further comprising forming a second thermal cap in physical connection with the through via.

7. The method of claim 1, wherein the first thermal cap has a diameter that is greater than the through via.

8. A method of manufacturing a semiconductor device, the method comprising:
    forming a thermal via through a first substrate;
    forming an antenna using the first substrate;
    attaching solder balls on a first side of the first substrate;
    electrically connecting the solder balls to a first semiconductor die through a redistribution layer, wherein after the electrically connecting the thermal via is located to remove heat from the first semiconductor die; and
    removing a second substrate from the redistribution layer after the electrically connecting.

9. The method of claim 8, further comprising forming a first thermal cap in physical contact with the thermal via.

10. The method of claim 9, wherein the first thermal cap has a first width, the first width being larger than a second width of the thermal via.

11. The method of claim 10, wherein after the forming the first thermal cap, the thermal via is also in physical contact with a second thermal cap, the second thermal cap having a third width larger than the second width.

12. The method of claim 11, further comprising forming a thermal pillar, wherein after the forming the thermal pillar the thermal pillar is in physical contact with the second thermal cap.

13. The method of claim 12, wherein the thermal pillar has a diameter of between about 50 µm and about 300 µm.

14. The method of claim 13, wherein the thermal pillar has a height of between about 10 µm and about 60 µm.

15. A method of manufacturing a semiconductor device, the method comprising:
    attaching a first semiconductor device to a first redistribution layer;
    placing a thermal via over the first semiconductor device, the thermal via extending from a first side of an antenna substrate to a second side of the antenna substrate, wherein an antenna is located at least partially within the antenna substrate and is electrically connected to the first semiconductor device through a redistribution layer; and
    removing a substrate from the redistribution layer.

16. The method of claim 15, further comprising, after the placing the thermal via, encapsulating the first semiconductor device with an encapsulant.

17. The method of claim 15, wherein the thermal via is in physical contact with a first thermal pad and a second thermal pad.

18. The method of claim 17, wherein the second thermal pad is in physical contact with a thermal pillar.

19. The method of claim 18, wherein the thermal pillar is copper.

20. The method of claim 19, wherein the first thermal pad is covered by a passivation layer.

* * * * *